United States Patent
Yu

(10) Patent No.: US 7,029,318 B2
(45) Date of Patent: Apr. 18, 2006

(54) ELECTRICAL CONNECTOR WITH IMPROVED SHELL

(75) Inventor: Hung-Chi Yu, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/945,604

(22) Filed: Sep. 20, 2004

(65) Prior Publication Data

US 2005/0064762 A1    Mar. 24, 2005

(30) Foreign Application Priority Data

Sep. 19, 2003    (TW) .............................. 92216896 U

(51) Int. Cl.
*H01R 13/648*    (2006.01)
(52) U.S. Cl. ...................... 439/488; 439/188; 439/607
(58) Field of Classification Search ................ 439/489, 439/488, 490, 491, 607–610, 188
See application file for complete search history.

(56) References Cited

U.S. PATENT DOCUMENTS

| 5,800,192 | A | * | 9/1998 | David et al. ................. 439/188 |
| 6,149,464 | A | * | 11/2000 | DeBauche et al. .......... 439/609 |
| 6,224,420 | B1 | | 5/2001 | Nisihio et al. |
| 6,508,678 | B1 | | 1/2003 | Yang |

* cited by examiner

*Primary Examiner*—Gary F. Paumen
(74) *Attorney, Agent, or Firm*—Wei Te Chung

(57) ABSTRACT

An electrical connector (100) is mounted on a printed circuit board (4) and is adapted for mating with a complementary connector. The printed circuit board has a detecting pad (41). The electrical connector includes an insulative housing (1), a conductive contact (3) retained in the housing and a metal shell (2) substantially covering the housing. The metal shell has a resilient detecting tab (22) to elastically abut against and electrically contact with the detecting pad during the electrical connector fully mating with the complementary connector.

16 Claims, 4 Drawing Sheets

ELECTRICAL CONNECTOR WITH IMPROVED SHELL

BACKGROUND OF THE INVENTION

1. Filed of the Invention

The present invention relates to an electrical connector for mounted on a printed circuit board, and more particularly to a connector having a shell.

2. Description of the Prior Art

Input/Output (I/O) connectors are used in a wide variety of electronic devices to electrically connect different types of devices to each other. In particular, such connectors are employed on the personal portable communication devices, such as mobile phones and personal digital assistants (PDA). They may perform a variety of functions, such as the connecting of the devices to a computer to establish a communications link, or the docking of the device to a docking station for the recharging of batteries, etc. I/O port connectors are traditionally mounted on circuit boards of the personal portable communication devices, and protrude to electrical connecting with external devices. U.S. Pat. No. 6,224,420 B1 and U.S. Pat. No. 6,508,678 B1 disclose of such conventional I/O port connectors mounted on the printed board for mating with complementary I/O plugs. Each conventional I/O port includes an insulative housing, a plurality of contacts received in the housing and a metallic shell shielding the housing for Electro Magnetic Interference (EMI) protection.

However, such conventional connectors haven't detecting means for detecting their engaging states. Because of absence of detecting means, if I/O plugs fail to fully mate with I/O ports for transmitting signals or powers, many accidents occur, such as transmission failures. In order to insure a reliable electrical connection, during mating the I/O plug with the I/O port together, operators tend to using relatively larger insertion forces, thereby inevitably bending contacts of the I/O plug or damaging the I/O plug or I/O port.

Hence, an improved electrical connector is desired to overcome the above-mentioned shortcomings.

BRIEF SUMMARY OF THE INVENTION

A main object of the present invention is to provide an electrical connector capable of detecting fully engagement with a mating connector.

In order to achieve the objects mentioned above and others, an electrical connector is mounted on a printed circuit board and is adapted for mating with a complementary connector. The printed circuit board has a detecting pad. The electrical connector includes an insulative housing, a conductive contact retained in the housing and a metal shell substantially covering the housing. The metal shell has a resilient detecting tab to elastically abut against and electrically contact with the detecting pad during the electrical connector fully mating with the complementary connector.

Other objects, advantages and novel features of the invention will become more apparent from the following detailed description when taken in conjunction with the accompanying drawings.

DETAILED DESCRIPTION OF THE INVENTION

Figure 1:
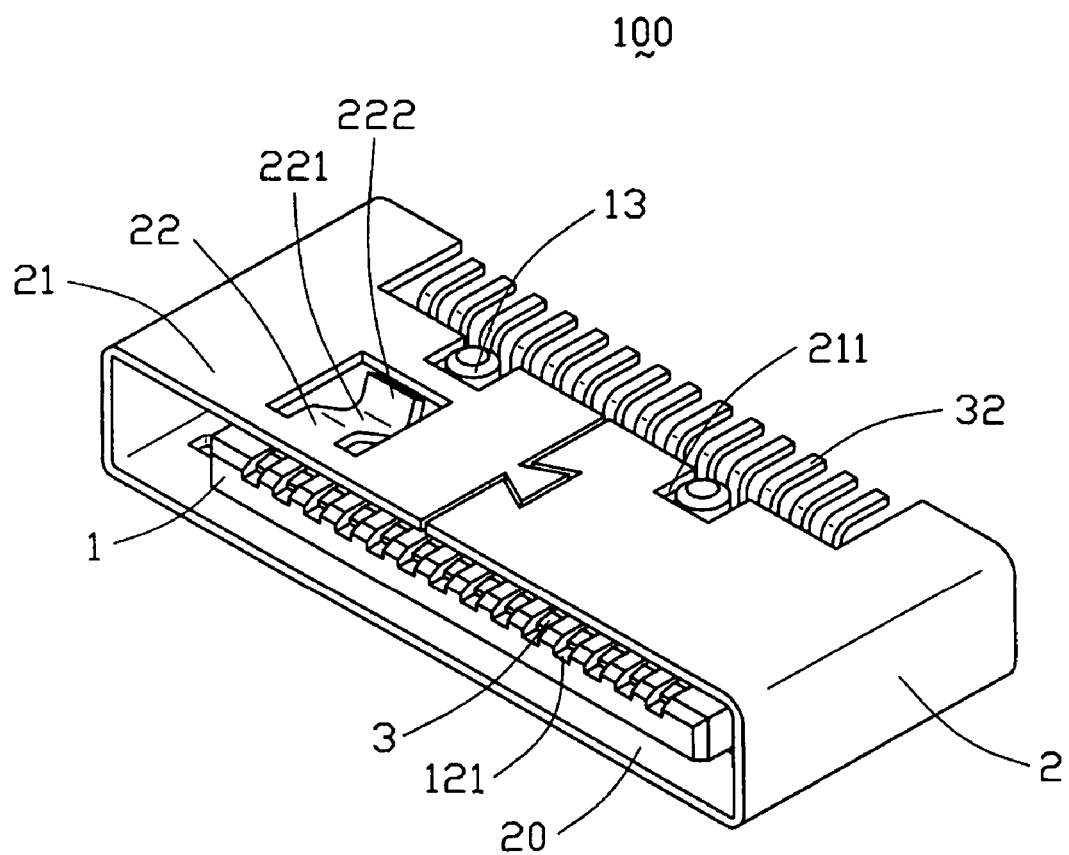
FIG. 1 is a perspective view of an electrical connector in accordance with the present invention.

The present invention will now be described with reference to drawings, and first to FIGS. 1 and 2. An electrical connector 100 according to the present invention is mounted on a printed circuit board (PCB) 4 and comprises a mating end 20, an insulative housing 1, a plurality of conductive contacts 3 received in the housing 1 and a metal shell 2 shielding the housing 1. The PCB 4 includes a plurality of solder pad (not shown) for soldering the contacts 3 thereon and a detecting pad 41 electrically connecting with a detecting loop (not shown) on the PCB 4 for engaging with the shell 2, as will be fully discussed.

Figure 2:
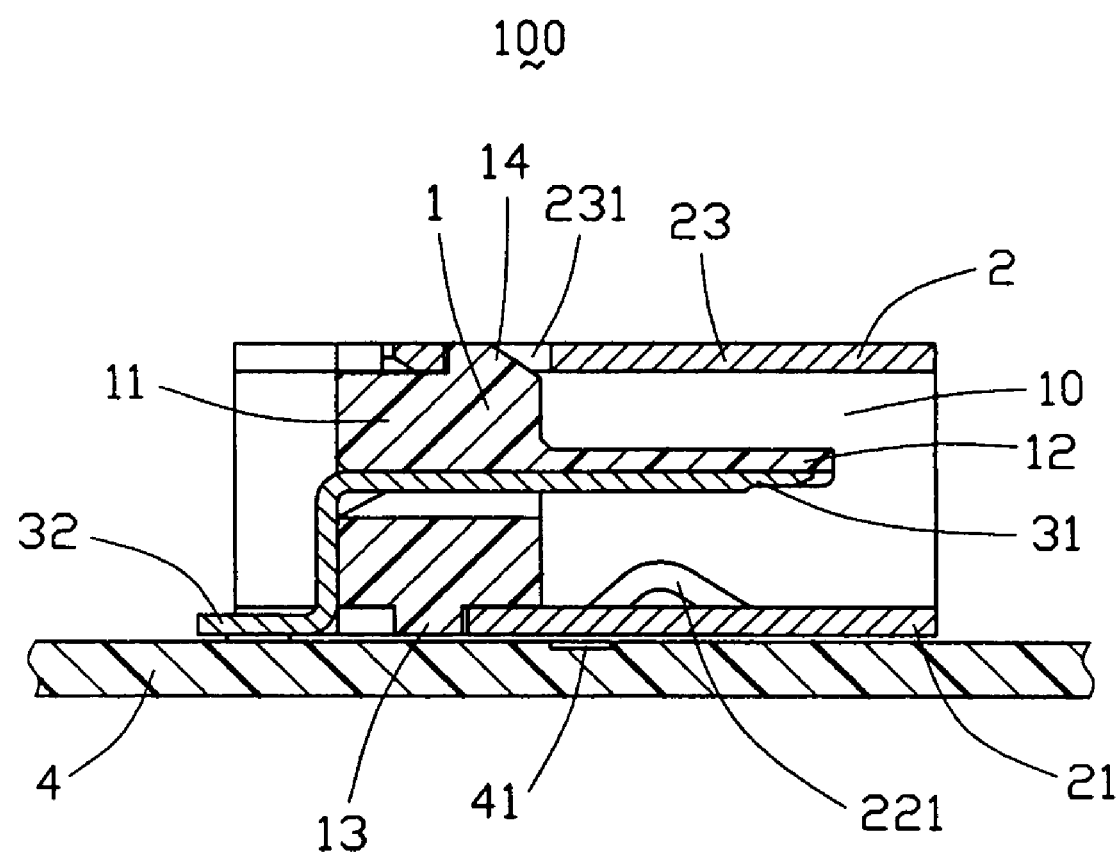
FIG. 2 is a cross-sectional view FIG. 1, wherein the electrical connector is mounted on a printed circuit board and is in a normal state.

Referring to FIG. 2, the housing 1 includes a body portion 11 and a tongue plate 12 extending forwardly toward the mating end 20 from the body portion 11. A plurality of recesses 121 are partially defined in a bottom surface of the tongue plate 12 in a front-to-rear direction and rearwardly extend through the body portion 12 for receiving the contacts 3. The body portion 11 includes a pair of posts 13 projecting downwardly from a bottom surface thereof and a plurality of protrusions 14 project upwardly from a top surface thereof.

As best shown in FIG. 2, each contact 3 includes a base portion (not labeled) retained in a corresponding recess 121, a mating portion 31 extending forwardly along the corresponding recess 121 from the base portion, and a soldering portion 32 extending downwardly and rearwardly from the base portion for being soldered to the PCB 4.

Figure 3:
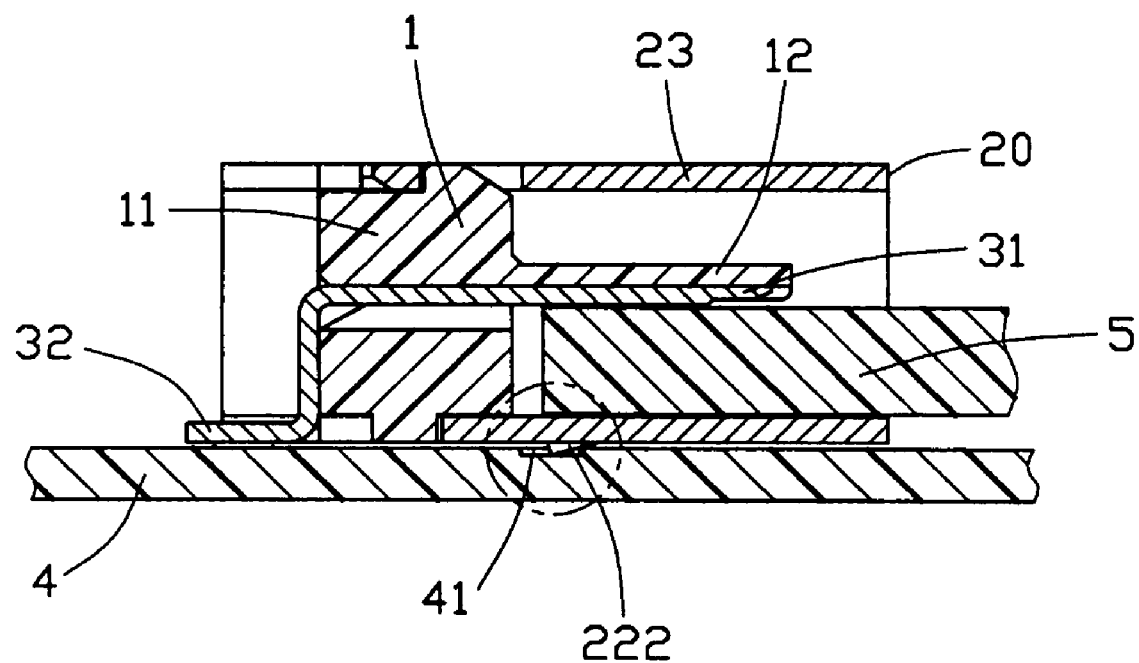
FIG. 3 is a view similar to FIG. 2, wherein the electrical connector fully engages with a mating connector.
Figure 4:
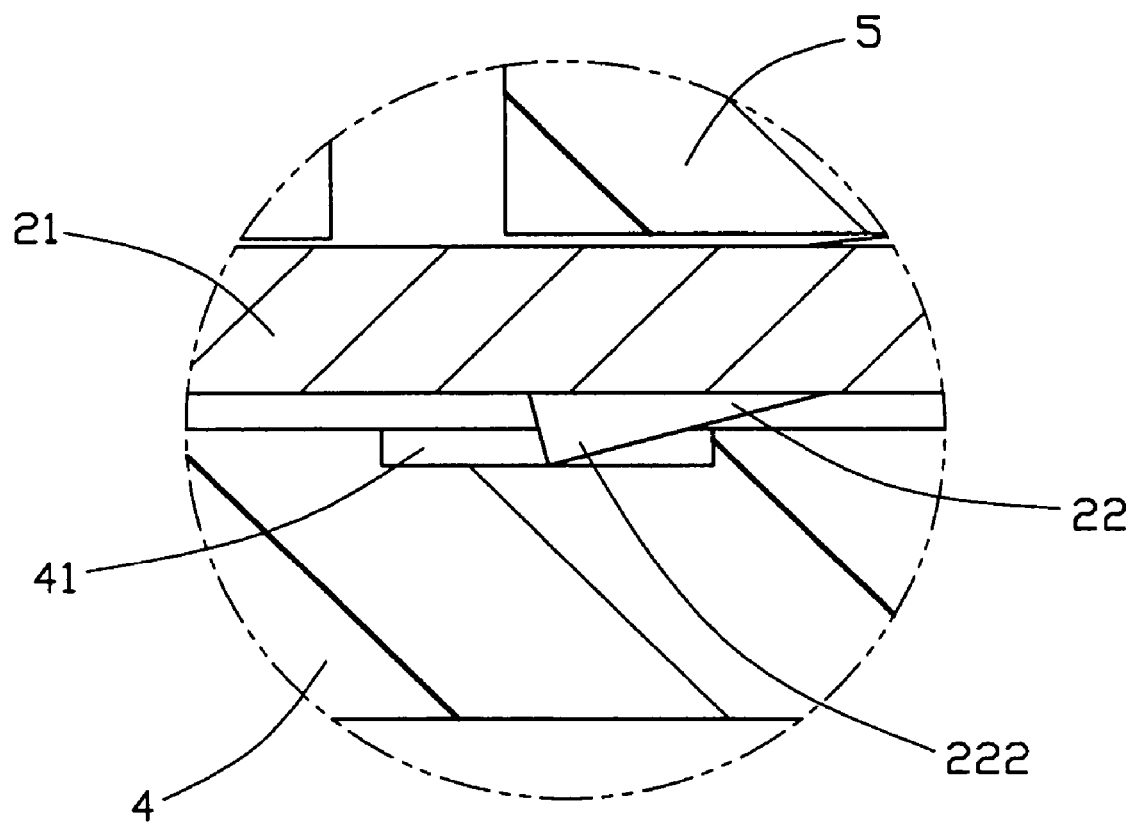
FIG. 4 is a partially enlarged view FIG. 3.

Referring to FIGS. 1, 2 and 3, the shell 2 is formed of a rectangular sheet metal material as one-piece structure and comprises two ends bent to each other to form a substantially rectangular sleeve, thereby defining a receiving cavity 10 for surrounding the housing 1 and for receiving a mating connector (not shown) therein. One end of the shell 2 has a swallow-tailed groove (not labeled), and the other end of the shell has a projecting swallow-tailed flange (not labeled) for being received in the groove. The shell 2 comprises a bottom plate 21, a top plate 23 and a pair of side plates (not labeled) joined the bottom plate 21 to the top plate 23. The bottom plate 21 and the soldering portions 32 of the contacts 3 are arranged at the same side of the electrical connector 100. The bottom plate 21 is stamped out a cantilevered resilient detecting tab 22 in a front-to-rear direction for engaging with the detecting pad 41 of the PCB 4. The detecting tab 22 includes a cantilevered resilient contacting portion 221 projecting upwardly and a detecting portion 222 downwardly extending from the contacting portion 221 for engaging with the detecting pad 41 of the PCB 4. The contacting portion 221 has a substantially convex surface upwardly projecting into the receiving cavity 10 for resiliently engaging with a mating portion 5 of the inserted mating connector. The bottom plate 21 further has a pair of cutouts 211 holding corresponding posts 13 therein. The top plate 23 defines a plurality of locking holes 231 engaging with corresponding protrusions 14.

Referring to FIGS. 1–4, in assembly, the electrical connector 100 is soldered to the PCB 4, thereby forming a detecting switch (not labeled). The detecting switch includes the detecting tab 22, the detecting loop on the PCB 4 and the detecting pad 41 electrically connecting with the detecting loop. The detecting portion 222 of the resilient detecting tab 22 of the bottom plate 2 is normally spaced away from the detecting pad 41 of the PCB 4 in the normally open condition of the detecting switch (FIG. 2), and the contacting portion 221 of the detecting tab 22 is positioned in the receiving cavity 10.

In using, when the mating connector is fully inserted into the receiving cavity 10 from the mating end 20 of the electrical connector 100, mating contacts (not shown) of the mating portion 5 of the inserted mating connector 5 mates with the contacts 3 of the electrical connector 100. The contacting portion 221 of the detecting tab 22 of the shell 2 is deflected downwardly by a bottom surface of the mating portion 5 of the inserted mating connector and urges the detecting portion 222 downwardly. As a result, the detecting portion 222 of the detecting tab 22 is urged downwardly to abut against and electrically connects with the detecting pad 41 of the PCB 4. Therefore, the engagement of detecting tab 22 and the detecting pad 41 of the PCB 4 can detect a fully engagement between the electrical connector 100 and the mating connector.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector mounted on a printed circuit board and adapted for mating with a complementary connector, the printed circuit board having a detecting pad, the electrical connector comprising;
   an insulative housing;
   a conductive contact retained in the housing; and
   a metal shell substantially covering the housing, the metal shell having a resilient detecting tab for being deflected by the complementary connector during mating to abut against and contact with the detecting pad.

2. The electrical connector according to claim 1, wherein the detecting tab is integrally formed with the shell in a front-to-rear direction.

3. The electrical connector according to claim 1, wherein the shell has a bottom plate far mounting on the printed circuit board, and wherein the detecting tab is integrally formed with the bottom plate of the shell and includes a cantilevered resilient contacting portion projecting inwardly and a detecting portion for contacting with the detecting pad of the printed circuit board.

4. The electrical connector according to claim 3, wherein the contacting portion has an upwardly projecting convex surface.

5. The electrical connector according to claim 1, wherein the shell is formed of sheet metal material as a one-piece structure and comprises two ends engaging each other.

6. The electrical connector according to claim 1, wherein the conductive contact has a soldering portion soldered to the printed circuit board, and wherein the soldering portion and the detecting tab are arranged at the same side of the electrical connector.

7. The electrical connector according to claim 1, wherein the detecting tab is deflected downwardly to abut against the detecting pad when the electrical connector filly mates with the complementary connector.

8. The electrical connector according to claim 1, wherein the housing has a post projecting downwardly from a bottom portion thereof, and wherein the shell has a cutout holding the post therein.

9. The electrical connector according to claim 1, wherein the housing has a protrusion projecting upwardly from a top portion thereof, and wherein the shell has a locking hole engaging with the protrusion.

10. An electrical connector assembly mounted on a printed circuit board and adapted for mating with a complementary connector, comprising:
    an insulative housing;
    a conductive contact received in the housing;
    a metallic shell substantially surrounding the housing; and
    a detecting switch adapted to be actuated by a full insertion of the complementary connector in response to full insertion thereof, the detecting switch disposed between the metallic shell and the printed circuit board and including a movable detecting tab and a detecting pad.

11. The electrical connector assembly according to claim 10, wherein the movable detecting tab is spaced away from the detecting pad to be in a normally open condition of the detecting switch.

12. The electrical connector assembly according to claim 11, wherein the switch is closed by the movably detecting tab electrically connecting with the detecting pad in response to full insertion of the complementary connector.

13. The electrical connector assembly according to claim 10, wherein the movable detecting tab is integrally formed with he metallic shell.

14. The electrical connector assembly according to claim 10, wherein the detecting pad is arranged on a printed circuit board.

15. An electrical connector assembly comprising:
    a printed circuit board having a detecting pad on a surface thereof;
    an electrical connector mounted to said surface, said connector including an insulative housing equipped with terminals and enclosed by a metallic shield, a mating face of the connector located near a front portion of the shield; wherein
    said shield is provided with a deflectable tang with a first section movable near the mating face and a second section movable near said detecting pad so that when a complementary connector is mated with the connector at the mating face, the first section is pressed and actuated to have the second section engaged with the detecting pad which is not engaged with the second section when said complementary connector is not mated with the connector.

16. The assembly as claimed in claim 15, wherein said first section extends into a mating port which is defined between the housing and the shield, when the complementary is not inserted into the mating port and mated with the connector.

* * * * *